(12) United States Patent
Nakabayashi

(10) Patent No.: US 7,474,683 B2
(45) Date of Patent: Jan. 6, 2009

(54) DISTRIBUTED FEEDBACK SEMICONDUCTOR LASER

(75) Inventor: Takashi Nakabayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/491,543

(22) Filed: Jul. 24, 2006

(65) Prior Publication Data

US 2007/0183470 A1   Aug. 9, 2007

(30) Foreign Application Priority Data

Jul. 25, 2005 (JP) .............................. P2005-214469

(51) Int. Cl.
*H01S 5/00* (2006.01)
*H01S 3/08* (2006.01)
(52) U.S. Cl. ...................................... 372/50.11; 372/96
(58) Field of Classification Search ............. 372/46.01, 372/43.01, 45, 50, 50.11, 96
See application file for complete search history.

(56) References Cited

U.S. PATENT DOCUMENTS

| | | | | |
|---|---|---|---|---|
| 5,345,464 A | * | 9/1994 | Takemoto | 372/46.014 |
| 5,717,710 A | * | 2/1998 | Miyazaki et al. | 372/50.11 |
| 6,821,798 B2 | * | 11/2004 | Arakawa et al. | 438/22 |
| 2003/0198266 A1 | * | 10/2003 | Ekawa | 372/45 |

OTHER PUBLICATIONS

N. Nakahara, et al., "1.3-μm InGaAlAs directly modulated MQW RWG DFB lasers operating over 10 Gb/s and 100°", Central Research Laboratory, Hitachi Ltd., OFC2004, ThD1.
A. Takemoto, et al., "1.3-μm Distributed Feedback Laser Diode with a Grating Accurately Controlled by a New Fabrication Technique", Journal of Lightwave Technology, vol. 7, No. 12 (1989), pp. 2072-2077.

* cited by examiner

*Primary Examiner*—Minsun Harvey
*Assistant Examiner*—Patrick Stafford
(74) *Attorney, Agent, or Firm*—Smith, Gambrell & Russell, LLP

(57) ABSTRACT

A distributed feedback semiconductor laser comprises a first cladding layer, a first optical guide layer, an active layer, a second optical guide layer, an InP semiconductor layer, an InGaAsP semiconductor layer, and a second cladding layer. The first optical guide layer is provided on the first cladding layer. The active layer is provided on the first optical guide layer. The second optical guide layer is provided on the active layer and made of AlGaInAs semiconductor. The InP semiconductor layer is provided on the second optical guide layer. The InGaAsP semiconductor layer is provided on the InP semiconductor layer. The second cladding layer is provided on the InGaAsP semiconductor layer and made of InP semiconductor. A diffraction grating for the distributed feedback semiconductor laser includes the InGaAsP semiconductor layer and the second cladding layer.

6 Claims, 5 Drawing Sheets

(a)

(b)

(a)

(b)

DISTRIBUTED FEEDBACK SEMICONDUCTOR LASER

BACKGROUND OF THE INVENTION

1. Field of the Invention

The present invention relates to a distributed feedback semiconductor laser.

2. Related Background Art

Distributed feedback lasers have a Bragg grating that uses a cladding layer of InP semiconductor and a SCH layer for separated confinement heterostructure (SCH), and light from an active layer is diffracted by the index difference between the SCH layer and the cladding layer of InP semiconductor. After forming the SCH layer by crystal growth technique, the Bragg grating is formed by etching. When the SCH layer is made of AlGaInAs, it is known that the crystal quality is deteriorated because of aluminum oxidation and so on in the etching of the AlGaInAs layer. In the SCH layer of AlGaInAs, the Bragg grating is formed in the InGaAsP layer grown on the AlGaInAs layer in order to obviate the aluminum oxidation. In order to prevent the increase of electrons overflowed from the active layer to the p-type cladding layer, a carrier stop layer of AlInAs may be provided between the SCH layer and the Bragg grating formation layer.

Publication 1 (K. Nakahara, et al., 1.3-umInGaAlAs directly modulated MQW RWG DFB lasers operating over 10 Gb/s and 100 degrees Celsius, Central Research Laboratory Hitachi Ltd., OFC2004, ThD1)

SUMMARY OF THE INVENTION

In the distributed feedback semiconductor laser disclosed in Publication 1, an AlInAs carrier stop layer, an InGaAsP diffraction grating layer and an InP cladding layer is sequentially formed on an AlGaInAs—SCH layer, and a diffraction grating includes the InGaAsP diffraction grating layer and the InP cladding layer. These layers are formed by an organometallic-vapor-phase epitaxy (OMVPE) method. In crystal growth by the OMVPE method, V-group raw material gas is continuously supplied and the start and stop of the crystal growth is controlled by turning on and off of the supply of III-group raw material gas. AlGaInAs and AlInAs contain arsenic (As) as V-group element, and InGaAsP contains arsenic (As) and phosphorus (P) as V-group element. Thus, the formation of the InGaAsP diffraction grating layer on AlGaInAs SCH layer or AlInAs carrier stop layer is performed out as follows. A V-group raw material gas containing arsenic (As) and a III-group raw material gas are supplied to a crystal growth furnace when the AlGaInAs SCH layer and AlInAs carrier stop layer are formed. Then, the arsenic-based raw material gas is still supplied after the III-group raw material gas has been stopped. After this interruption of the growth, the III-group raw material gas is supplied again to start the growth of the InGaAsP diffraction grating layer. For this growth, the V-group raw material gas containing arsenic (As) and the V-group raw material gas containing phosphorus (P) are supplied to the crystal growth furnace. In the growth of the InGaAsP diffraction grating layer, the ratio As/P of the arsenic-based material gas to the phosphorus-based material gas is required to be about As/P=1/50 in the crystal growth furnace.

In the above sequence, the arsenic-based material gas as V-group gas is supplied just before starting the growth of the diffraction grating layer, and the arsenic-based material gas and the phosphorus-based material gas are supplied in the growth of the InGaAsP diffraction grating layer (the ratio As/P of the arsenic-based material gas to the phosphorus-based material gas is small). For this small ratio, the supply amount of the arsenic-based material gas is controlled to decrease it to form the InGaAsP diffraction grating layer. However, the ratio of the arsenic-based material gas to the phosphorus-based material gas (As/P) is not rapidly decreased to a desired value, As/P=1/50, because the arsenic-based material gas remains in the crystal growth furnace. In the formation of the InGaAsP diffraction grating layer, the number of crystal defects created therein is increased if the ratio (As/P) of the arsenic-based material gas to the phosphorus-based material gas is greater than the desired value (for example, As/P=1/50).

It is an object of the present invention to provide a distributed feedback laser which has a small number of crystal defects in a diffraction grating layer thereof.

A distributed feedback semiconductor laser according to the present invention comprises a first cladding layer, a first optical guide layer provided on the first cladding layer, an active layer provided on the first optical guide layer, a second optical guide layer provided on the active layer and made of AlGaInAs semiconductor, an InP semiconductor layer provided on the second optical guide layer, an InGaAsP semiconductor layer provided on the InP semiconductor layer, and a second cladding layer provided on the InGaAsP semiconductor layer and made of InP semiconductor. A diffraction grating of the distributed feedback semiconductor laser includes the InGaAsP semiconductor layer and the second cladding layer.

According to the distributed feedback semiconductor laser of the present invention, after the InP semiconductor layer is grown on the second optical guide layer, and the InGaAsP semiconductor layer is formed on this InP semiconductor layer. A V-group material gas supplied to the crystal growth furnace to grow the InP semiconductor layer is phosphor-based material gas. The V-group material gas supplied to the crystal growth furnace for avoiding the desorption of atoms from the epitaxial growth surface of the InP semiconductor layer is phosphor-based material gas in the interruption period of the stop of the growth of the InP semiconductor layer to the start of the InGaAsP semiconductor layer. When the InGaAsP diffraction grating layer is formed on the InP layer, the phosphor-based material gas and the arsenic-based material gas are supplied, and the supply amount of the arsenic-based material gas is smaller than that of the phosphor-based material gas. Thus, most of the supply amount of V-group material gas is phosphor-based material gas before and after the start of the growth of the InGaAsP diffraction grating layer, and the flow rate change of the arsenic-based material gas is small. In the formation of the InGaAsP diffraction grating layer, the ratio As/P of the arsenic-based material gas to the phosphor-based material gas can be rapidly changed to a desired value (for example, As/P =1/50). Accordingly, the number of defects in the InGaAsP diffraction grating layer is decreased.

The distributed feedback semiconductor laser according to the present invention further comprises a carrier stop layer made of AlInAs semiconductor and provided between the second optical guide layer and the InP semiconductor layer. The first cladding layer is made of n-type InP semiconductor, and the second cladding layer is made of p-type InP semiconductor. According to this structure, the carrier stop layer reduces the overflow of electrons flowing from the active layer to the p-type cladding layer.

The distributed feedback semiconductor laser according to the present invention further comprises a carrier stop layer made of AlInAs semiconductor and provided between the first optical guide layer and the first cladding layer. The first cladding layer is made of p-type InP semiconductor, and the second cladding layer is made of n-type InP semiconductor. According to this structure, the carrier stop layer reduces the overflow of electrons flowing from the active layer to the p-type cladding layer.

It is preferable that thickness of the InP semiconductor layer of the distributed feedback semiconductor laser according to the present invention be equal to or less than 10 nanometers. According to this structure, since the thickness of the InP semiconductor layer is equal to or less than 10 nanometers, resistance increase from the hole barrier at the heterointerface of the InP semiconductor layer and the diffraction grating layer is presented.

DETAILED DESCRIPTION OF THE PREFERRED EMBODIMENTS

Referring to the accompanying drawings, embodiments of the present invention will be explained. When possible, parts identical to each other will be referred to with symbols identical to each other.

Figure 1:
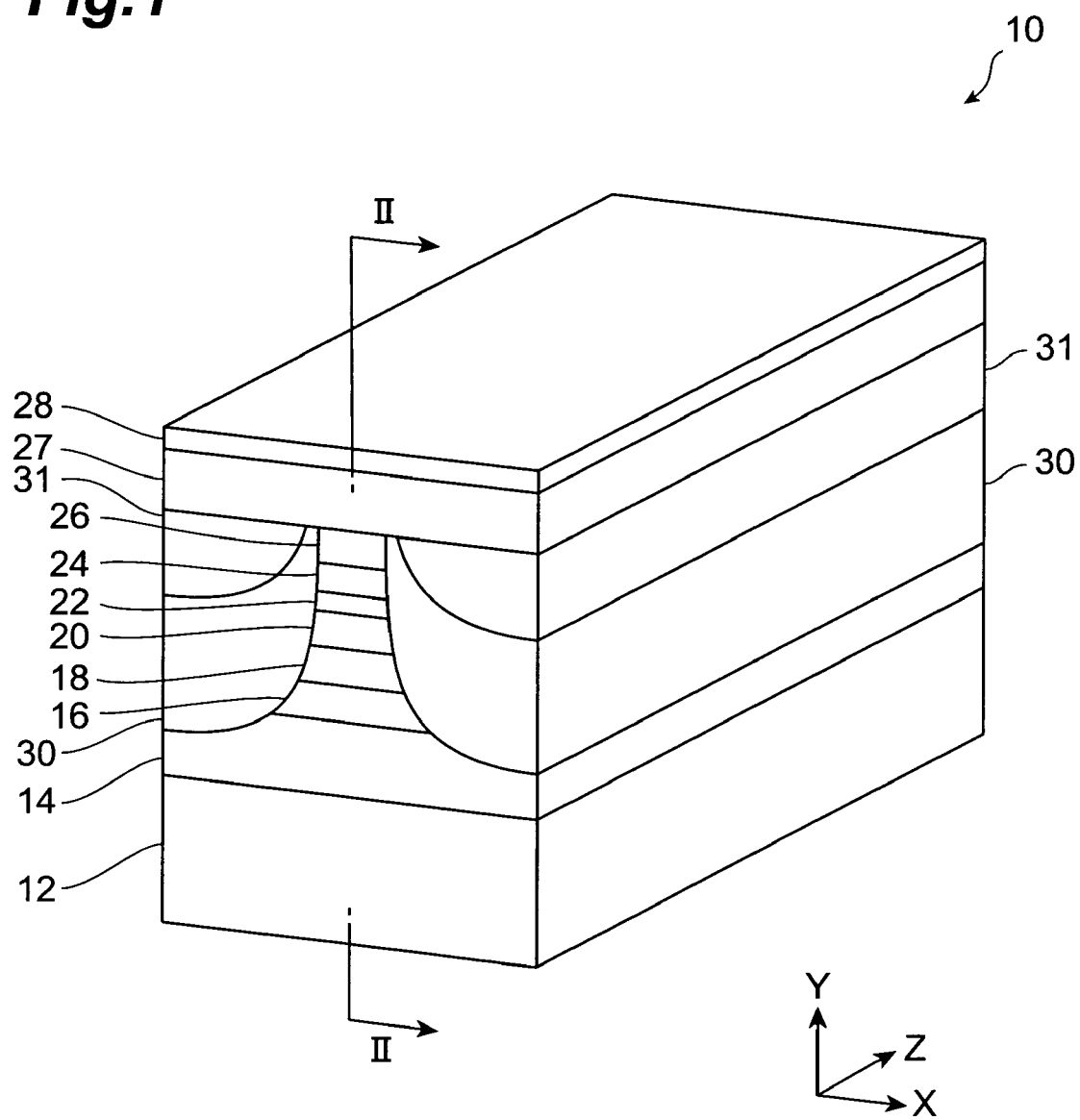
FIG. 1 is a diagrammatic perspective view showing the structure of a distributed feedback semiconductor laser according to the present embodiment.
Figure 2:
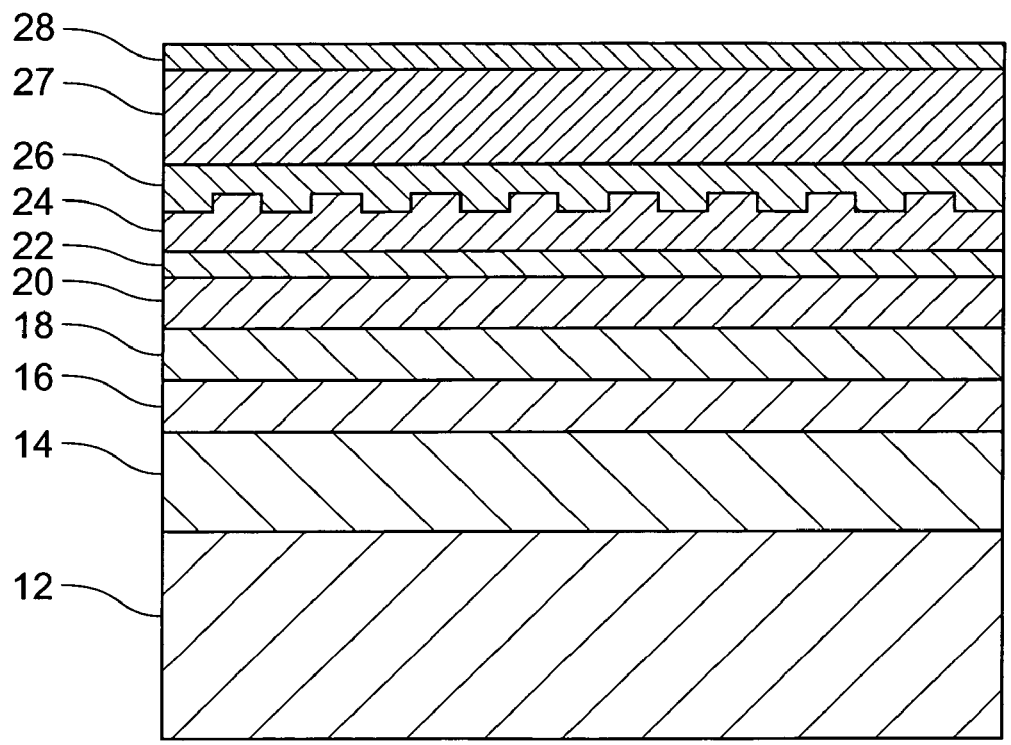
FIG. 2 is a view showing the cross section taken along the II-II line shown in FIG. 1.
Figure 2:
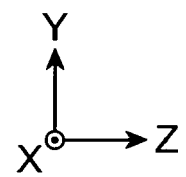

FIG. 1 is a diagrammatic perspective view showing the structure of a distributed feedback semiconductor laser according to the present embodiment. FIG. 2 is a view showing the cross section taken along the II-II line shown in FIG. 1. Referring to FIGS. 1 and 2, a number of semiconductor layers are provided on an n-type InP substrate 12 in a distributed feedback semiconductor laser 11. A first n-type Inp cladding layer 14 is provided on the n-type InP substrate 12, a first optical guide AlGaInAs layer 16 is provided on the first n-type InP cladding layer 14, an AlGaInAs active layer 18 is provided on the first optical guide AlGaInAs layer 16, a second optical guide AlGaInAs layer 20 is provided on the active layer 18, an InP semiconductor layer 22 is provided on the second optical guide layer 20, a p-type InGaAsP semiconductor layer (hereinafter referred to as a diffraction grating layer) 24 is provided on the InP semiconductor layer 22, a second p-type InP cladding layer 26 is provide on the diffraction grating layer 24, a second p-type InP cladding layer 27 is provide on the second p-type InP cladding layer 26, and a contact layer 28 is provided on the second cladding layer 27.

The first optical guide layer 16, the active layer 28 and the second optical guide layer 20 form a separated confinement heterostructure. The active layer 18 is provided between the first optical guide layer 16 and the second optical guide layer 20 and thus the first and the second optical guide layer 16, 20 function to confine carriers (electrons and holes) into the active layer 18.

The first optical guide layer 16, the active layer 18, and the second optical guide layer 20 are provided between the first cladding layer 14 and the second cladding layers 26, 27. The first and second cladding layers 14, 26, 27 are made of materials of refractive indices smaller than those of the first and second optical guide layers 16, 20 and the active layer 18, and thus these layers 14, 26, 27 function to confine light to the layers 16, 18, 20.

The active layer 18 has a multiple quantum well structure (MQW), for example. Carriers are injected into the active layer 18 from the first cladding layer 14 and the second cladding layers 26, 27 through the first and second optical guide layers 16, 20. The injected carriers are combined in the active layer to generate light.

The diffraction grating layer 24 is provided between the second optical guide layer 20 and the second cladding layers 26, 27. The Bragg grating is constituted by the diffraction grating layer 24 and the second cladding layers 26, 27. The periodic structure of the diffraction grating extends in the Z direction, and the diffraction grating diffracts a part of the light propagating in the Z direction to the reverse direction. Therefore, the period of the diffraction grating defines the wavelength of light from the distributed feedback semiconductor laser.

The InP semiconductor layer 22 is provided between the diffraction grating layer 24 and the second optical guide layer 20. In the present embodiment, the thickness of the InP semiconductor layer 22 is less than 20 nm, and thus resistance increase due to hole barrier from the heterobarrier at the interface of the InP semiconductor layer 22 and the diffraction grating layer 24 is reduced.

The first optical guide layer 16, the active layer 18, the first and second optical guide layer 20, the InP semiconductor layer 22, the diffraction grating layer 24 and the second cladding layers 26 form a stripe which extend in the Z direction perpendicular to the XY plane shown in FIG. 1. The stripe is buried by the p-type InP current block layer 30 and the n-type InP current block layer 30. These current block layers 30, 31 confine current flowing from one of the first cladding layer 14 and the second cladding layers 27 to the other into the stripe. Therefore, electrons and holes injected from the first and second cladding layers 14 and 27 are guided to the active layer 18.

In the semiconductor laser 10 according to the present embodiment, after the InP semiconductor layer 22 is grown on the second optical guide layer 20, the InGaAsP semiconductor layer 24 is grown on the InP semiconductor layer 22. V-group material gas supplied to the crystal growth furnace for growing the InP semiconductor layer 22 contains only phosphorus-based material gas. Further, V-group material gas supplied to the crystal growth furnace for preventing the desorption of atoms from the epitaxially grown surface of the InP semiconductor prior to starting to grow the next InGaAsP semiconductor layer 24 after stopping the growth of the InP semiconductor layer 22 contains only phosphorus-based material gas.

The amount of the phosphorus-based material gas supplied to the crystal growth furnace for growing the InGaAsP semiconductor layer 24 is substantially equal to the amount of the phosphorus-based material gas supplied to the crystal growth furnace for growing the InP semiconductor layer 22, and a small amount of arsenic-based gas is supplied in the growth thereof. Accordingly, the ratio of the arsenic-based gas to the phosphorus-based gas can be set to the desired value (As/P =1/50) from the beginning of growing the InGaAsP semiconductor layer 24. Therefore, the occurrence of crystal defects in the diffraction grating semiconductor layer 24, i.e., the InGaAsP semiconductor layer 24, is reduced. Consequently, the crystal quality of the InGaAsP semiconductor layer 24 is improved and the reliability of the distributed feedback semiconductor laser 10 is also improved.

The distributed feedback semiconductor laser according to the present embodiment can include an AlInAs carrier stop layer provided between the second optical guide layer and the InP semiconductor layer. This structure permits the AlInAs carrier stop layer to reduce the carrier overflow of electrons that flow from the active layer to the p-type cladding layer. Therefore, this distributed feedback semiconductor laser prevents the increase of the leakage current.

Figure 3:
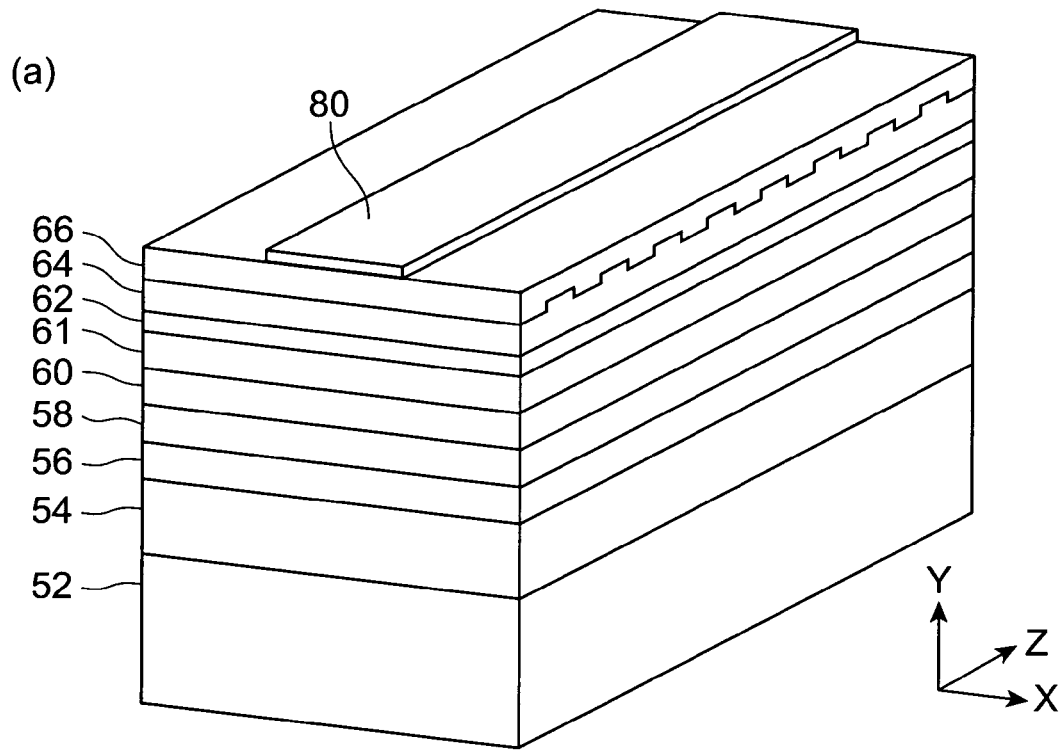
FIG. 3 is a diagrammatic perspective view showing the manufacturing steps of the distributed feedback semiconductor laser according to the present embodiment.
Figure 3:
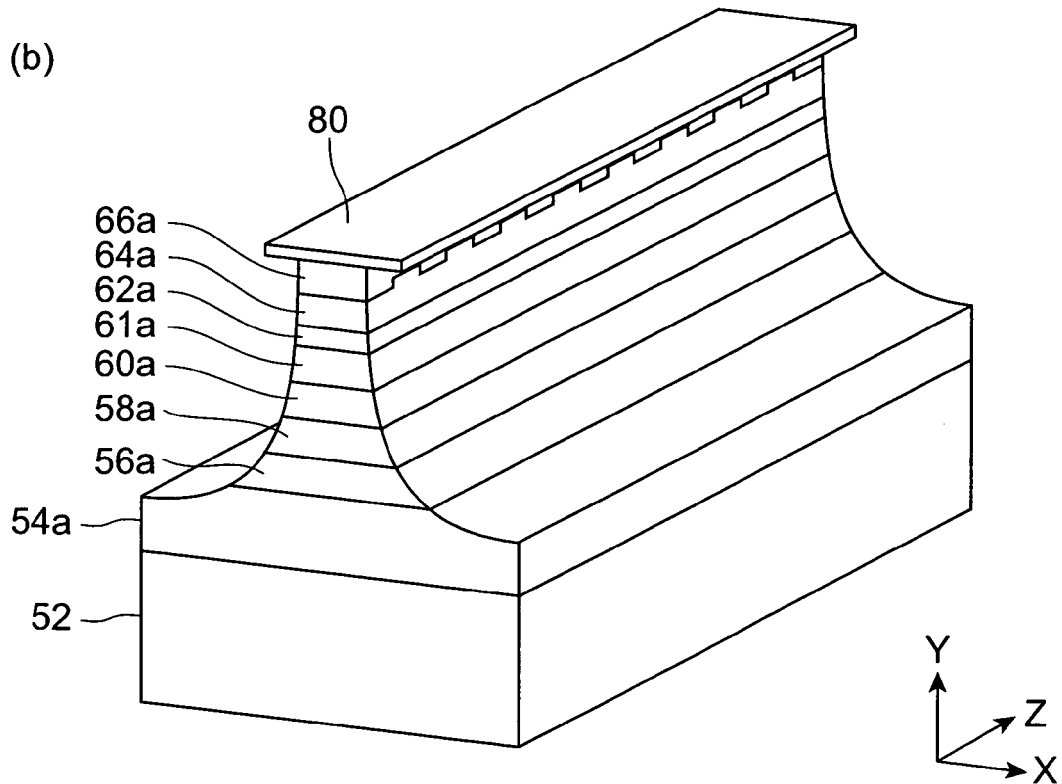
Figure 4:
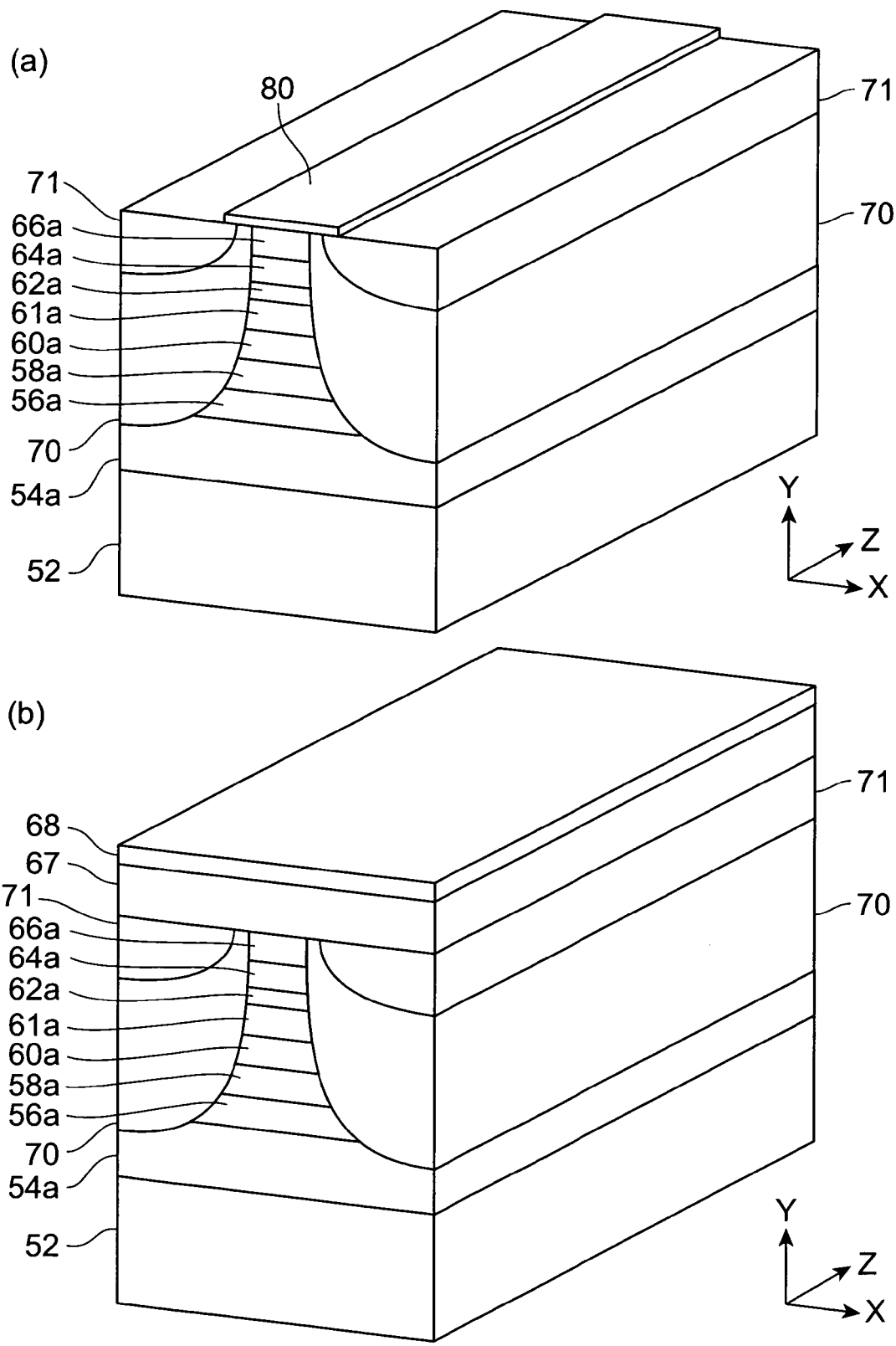
FIG. 4 is a diagrammatic perspective view showing the manufacturing steps of the distributed feedback semiconductor laser according to the present embodiment.

In the following, a method of fabricating the distributed feedback semiconductor laser according to the embodiment of the present invention will be explained. FIGS. 3 and 4 show diagrammatic perspective views of the manufacturing steps of the distributed feedback semiconductor laser 10.

(First Semiconductor Layer Deposition Step)

First, a layer stack of semiconductor layers is formed on an n-type InP substrate 52. As shown in Part (a) of FIG. 3, a first cladding layer 54 of n-type InP, a first optical guide layer 56 of AlGaInAs, an active layer 58 of AlGaInAs, a second optical guide layer 60 of AlGaInAs, a carrier stop layer 61 of AlInAs, an InP semiconductor layer 62, a p-type InGaAsP semiconductor layer (diffraction grating layer) 64 and a second cladding layer 66 of p-type InP are sequentially formed on the n-type InP substrate 52. These semiconductor layers are grown using organo-metallic vapor-phase epitaxy (OM-VPE) method.

Figure 5:
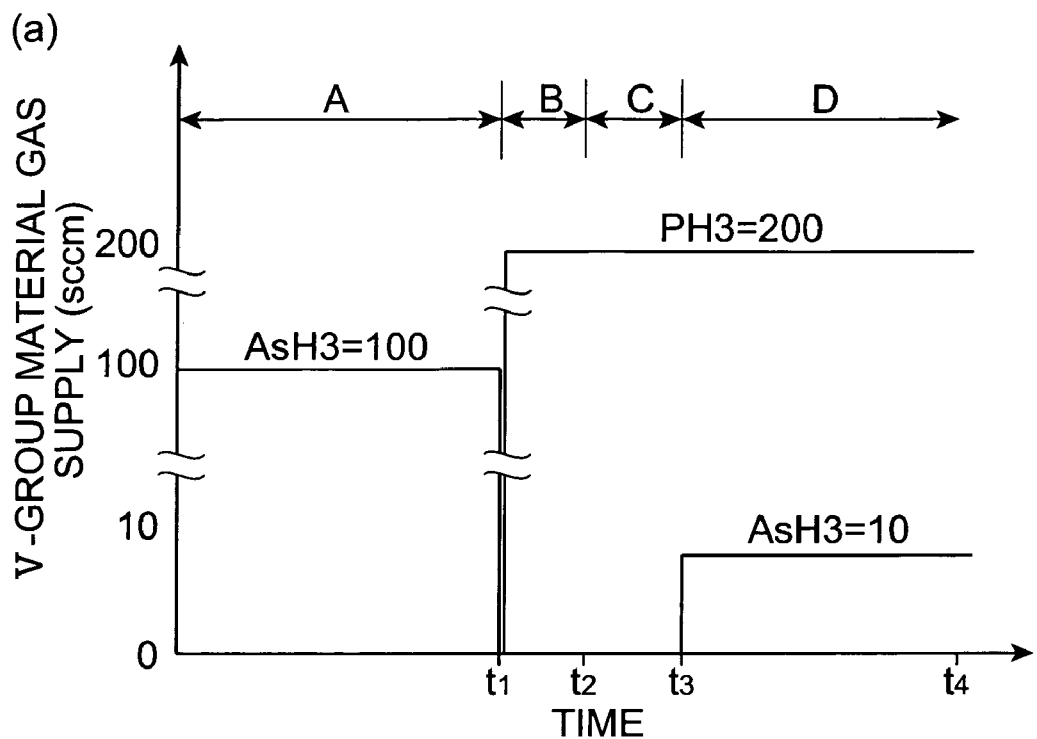
FIG. 5 is a time chart showing the supply amounts of the V-group gas and III-group gas in steps from the formation of AlInAs carrier stop layer to that of the diffraction grating layer.
Figure 5:
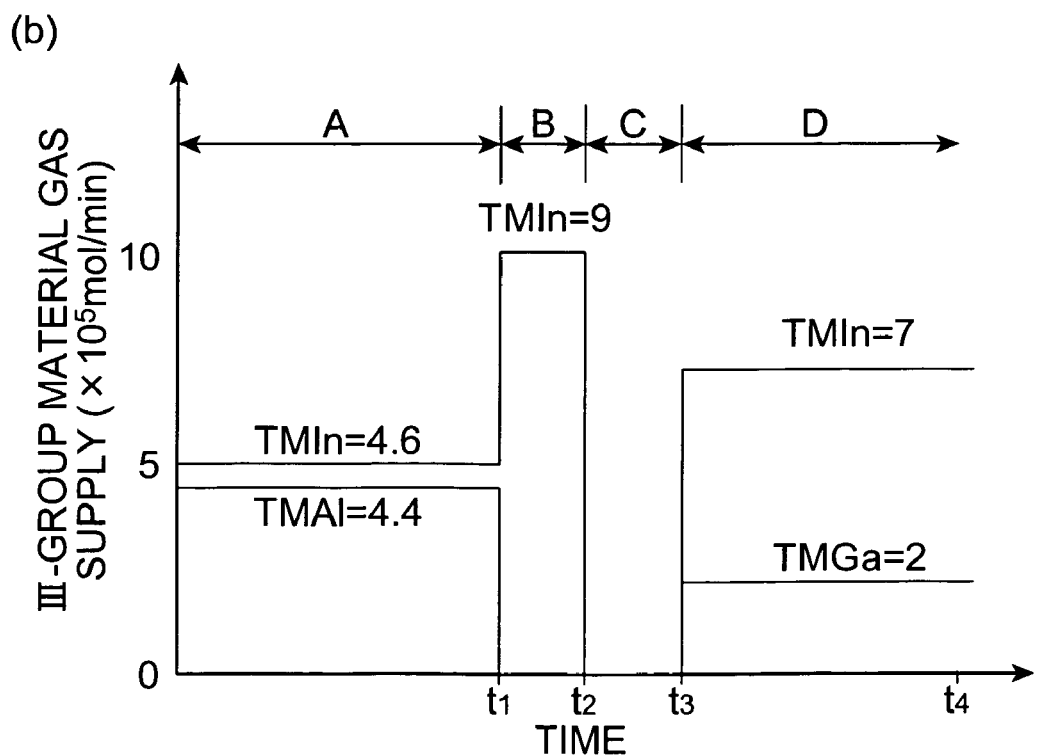

Fabrication in the range of the step of forming the AlInAs carrier stop layer 61 to the step of forming the diffraction grating layer 64 will be explained in the following. Part (a) of FIG. 5 is a view showing the supply amount of V-group material gases in the formation steps of the AlInAs carrier stop layer 61 to the diffraction grating layer 64. Part (b) of FIG. 5 is a view showing the supply amount of III-group material gases in the formation steps of the AlInAs carrier stop layer 61 to the diffraction grating layer 64. First, III-group material gases containing aluminum (Al) and indium (In) and a V-group material gas containing arsenic (As) are supplied to the crystal growth furnace (Step A) to form the carrier stop layer 61.

In one example of the present embodiment, trimethyl-aluminum (TMAl) and trimethyl-indium (TMIn) are used as III-group gases containing aluminum and indium, respectively. Arsine ($AsH_3$) is used as a V-group gas containing arsenic. In one example, the supply amounts of the TMAl and TMIn are $4.4 \times 10^5$ mol/min and $4.6 \times 10^5$ mol/min, respectively, and the supply amount of the $AsH_3$ is 100 sccm. The temperature of the crystal growth furnace is, for example, 650 degrees Celsius.

Next, at time t1, the supply of $AsH_3$ gas is stopped and the supply of V-group material gas containing phosphorus (P) is started. Further, at time t1, the supply of TMAl gas is stopped and the supply amount of TMIn is changed to form the InP semiconductor layer 62 (Step B).

In one example of the present embodiment, TMIn gas is used as a III-group material gas containing indium (In) and phosphine (PH3) gas is used as a V-group material gas containing phosphorus (P). In one example, the supply amount of TMIn is $9 \times 10^5$ mol/min and the supply amount of $PH_3$ is 200 sccm. The temperature of the crystal growth furnace is, for example, 650 degrees Celsius.

At time t2, the supply of III-group material gas is stopped to terminate the growth of the InP semiconductor layer, and the atmosphere of the crystal growth furnace is changed (Step C). In Step C, the supply of V-group material gas containing P is maintained in order to restrict the desorption of atoms from the epitaxial growth surface of the InP semiconductor layer 62.

In one example of the present embodiment, the supply of the TMIn gas is stopped and only $PH_3$ gas is still supplied. The supply amount of $PH_3$ of 200 sccm gas is maintained in order to form the diffraction grating layer 64. The temperature of the crystal growth furnace is, for example, 650 degrees Celsius.

Next, the supply of V-group material gas containing phosphorus (P) remains unchanged and, at time t4, the V-group material gas containing arsenic (As), III-group material gas containing aluminum (Al) and III-group material gas containing gallium (Ga) are supplied to the crystal growth furnace to form the diffraction grating layer 64 (Step D).

In one example of the present embodiment, TMIn gas and TMGa gas are used as III-group gases containing indium (In) and gallium (Ga), respectively, $AsH_3$ is used as a V-group material gas containing arsenic (As), and $PH_3$ gas is used as a V-group material gas containing phosphorus (P). In one example, the supply amounts of TMIn gas and TMGa gas are $7 \times 10^5$ mol/min and $2 \times 10^5$ mol/min, respectively, and the supply amounts of $AsH_3$ and $PH_3$ are 10 sccm and 200 sccm, respectively. The temperature of the crystal growth furnace is, for example, 650 degrees Celsius.

In Steps B to D, phosphorus (P)—based gas is used as V-group material gas and, the flow ratio of arsenic (As)—based gas the supply of which is started in Step D is smaller as compared to phosphorus (P)—based gas. Therefore, the ratio of arsenic (As)—based gas to phosphorus (P)—based gas is controlled to a desired value (As/P =1/50) with high accuracy.

(Mask Formation Step)

Next, an etching mask is formed on a second cladding layer 66. As shown in part (a) of FIG. 3, in order to form the etching mask 80, a mask layer is deposited on the second cladding layer 60 and is etched to a predetermined pattern using photolithography. The mask layer 80 has a stripe shape that extends in the Z direction perpendicular to the XY plane. For example, insulator, such as silicon dioxide ($SiO_2$) and silicon nitride (SiN), is used as the material of the mask layer.

(Mesa Formation Step)

As shown in Part (b) of FIG. 3, the first cladding layer 54, the first optical guide layer 56, the active layer 58, the second optical guide layer 60, the carrier stop layer 61, the InP semiconductor layer 62, the diffraction grating layer 64, and the second cladding layer 66 are etched to form a semiconductor mesa including the first cladding layer 54a, the first optical guide layer 56a, the active layer 58a, the second optical guide layer 60a, the carrier stop layer 61a, the InP semiconductor layer 62a, the diffraction grating layer 64a, and the second cladding layer 66a.

(Current Block Layer Formation Step)

A p-type InP current block layer 70 and an n-type InP current block layer 71 are sequentially formed on the first cladding layer 54a without removing the mask layer to bury the semiconductor mesa including the first optical guide layer 56a, the active layer 58a, the second optical guide layer 60a, the carrier stop layer 61a, the InP semiconductor layer 62a, the diffraction grating layer 64a, and the second cladding layer 66a. As shown in Part (a) of FIG. 4, these current block layers 70 and 71 are not deposited on the mask layer 80, and are selectively grown on the side of the semiconductor mesa. Therefore, the mesa formed by the etching is buried to the planarized surface.

(Second Semiconductor Layer Deposition Step)

After removing the mask layer, a stack including a number of semiconductor layer is formed on the second cladding layer 66a. As shown in Part (b) of FIG. 4, a second p-type cladding layer 67 and a contact layer 68 are sequentially formed on the current block layers 70 and 71. These semiconductor layers are grown by OMVPE.

Thereafter, a step of forming electrodes, such as anode electrode and cathode electrode is carried out. According to the above steps, the fabrication of the semiconductor laser 10 shown in FIG. 1 is completed.

The present invention is not limited to the present embodiments and a variety of modifications can be provided. In one modified distributed feedback semiconductor layer, the carrier stop layer provided between the second optical guide layer and the InP semiconductor layer may not be contained. Furthermore, another modified distributed feedback semiconductor laser has the following: a p-type semiconductor substrate is used in place of the n-type InP substrate 12; a first p-type InP cladding layer is used in place of the first n-type cladding layer 14; an n-type diffraction grating formation layer is used in place of the p-type diffraction grating formation layer 24; and second cladding layers are formed in place of the second p-type cladding layers 26, 27.

The above modified distributed feedback semiconductor laser further comprise AlInAs carrier stop layer provided between the first p-type InP cladding layer and the first optical guide layer.

In the distributed feedback semiconductor laser according to the present invention, the active layer has an MQW structure, and the active layer may have a single quantum structure (SQW) and a quantum dot structure.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A distributed feedback semiconductor laser comprising:
    a first cladding layer;
    a first optical guide layer provided on the first cladding layer;
    an active layer of AlGaInAs provided on the first optical guide layer;
    a second optical guide layer provided on the active layer and made of AlGaInAs semiconductor;
    an InP semiconductor layer provided on the second optical guide layer;
    an InGaAsP semiconductor layer provided on the InP semiconductor layer;
    a second cladding layer provided on the InGaAsP semiconductor layer and made of InP semiconductor; and
    a current blocking semiconductor region burying a stripe mesa, the stripe mesa including the first optical guide layer, active layer, second optical guide layer, InP semiconductor layer and InGaAsP semiconductor layer, and the stripe mesa extending in a predetermined direction; and
    a diffraction grating for the distributed feedback semiconductor laser in the stripe mesa, the diffraction grating being at an interface of the InGaAsP semiconductor layer and the second cladding layer, and the interface having a periodic shape to provide the diffraction grating.

2. The distributed feedback semiconductor laser according to claim 1, further comprising a carrier stop layer made of AlInAs semiconductor and provided between the second optical guide layer and the InP semiconductor layer, the first cladding layer being made of n-type InP semiconductor, and the second cladding layer being made of p-type InP semiconductor.

3. The distributed feedback semiconductor laser according to claim 1, further comprising a carrier stop layer made of AlInAs semiconductor and provided between the first optical guide layer and the first cladding layer, the first cladding layer being made of p-type InP semiconductor, and the second cladding layer being made of n-type InP semiconductor.

4. The distributed feedback semiconductor laser according to claim 1, wherein thickness of the InP semiconductor layer is equal to or less than 10 nanometers.

5. The distributed feedback semiconductor laser according to claim 2, wherein thickness of the InP semiconductor layer is equal to or less than 10 nanometers.

6. The distributed feedback semiconductor laser according to claim 3, wherein thickness of the InP semiconductor layer is equal to or less than 10 nanometers.

* * * * *